(12) United States Patent
Chu et al.

(10) Patent No.: US 10,535,560 B2
(45) Date of Patent: Jan. 14, 2020

(54) INTERCONNECTION STRUCTURE OF SEMICONDUCTOR DEVICE

(71) Applicant: Taiwan Semiconductor Manufacturing Co., Ltd., Hsinchu (TW)

(72) Inventors: Wei-Chen Chu, Taichung (TW); Hsiang-Wei Liu, Tainan (TW); Tai-I Yang, Hsinchu (TW); Chia-Tien Wu, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 15 days.

(21) Appl. No.: 15/652,901

(22) Filed: Jul. 18, 2017

(65) Prior Publication Data

US 2019/0027406 A1   Jan. 24, 2019

(51) Int. Cl.
*H01L 21/768* (2006.01)
*H01L 23/522* (2006.01)

(52) U.S. Cl.
CPC .. *H01L 21/76885* (2013.01); *H01L 21/76852* (2013.01); *H01L 23/5226* (2013.01); *H01L 21/76864* (2013.01)

(58) Field of Classification Search
CPC ........... H01L 21/76849; H01L 21/7685; H01L 21/76852; H01L 21/76885; H01L 23/5226; H01L 23/5329–53295; H01L 21/76801–76837; H01L 23/53223; H01L 2221/1073–1089; H01L 21/76807–76813; H01L 2221/1015–1036; H01L 21/76841–76876; H01L 21/76898; H01L 23/481; H01L 23/53238; H01L 23/53266
USPC ......................................... 257/751, 758, 774
See application file for complete search history.

(56) References Cited

U.S. PATENT DOCUMENTS

| 7,157,370 | B2 * | 1/2007 | Inoue | H01L 21/76852 257/758 |
| 2001/0038147 | A1 * | 11/2001 | Higashi | H01L 21/288 257/750 |
| 2013/0069233 | A1 * | 3/2013 | Chou | H01L 21/768 257/751 |

(Continued)

*Primary Examiner* — Nelson Garces
(74) *Attorney, Agent, or Firm* — Birch, Stewart, Kolasch & Birch, LLP (57) ABSTRACT

Structures and formation methods of a semiconductor device structure are provided. The semiconductor device structure includes a first conductive feature in a first dielectric layer and a second conductive feature over the first dielectric layer. The semiconductor device structure also includes a conductive via between the first conductive feature and the second conductive feature. The conductive via includes an etching stop layer over the first conductive feature, a conductive pillar over the etching stop layer, and a capping layer surrounding the conductive pillar and the etching stop layer. The first conductive feature and the second conductive feature are electrically connected to each other through the capping layer, the conductive pillar, and the etching stop layer. The semiconductor device structure further includes a second dielectric layer over the first dielectric layer and below the second conductive feature. The second dielectric layer surrounds the conductive via.

20 Claims, 8 Drawing Sheets

(56) References Cited

U.S. PATENT DOCUMENTS

2018/0083115 A1* 3/2018 Clifton ............... H01L 29/4966

* cited by examiner

INTERCONNECTION STRUCTURE OF SEMICONDUCTOR DEVICE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying FIGURES. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIGURES. The spatially relative terms are intended to encompass different orientations of the device in use or operation in addition to the orientation depicted in the FIGURES. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1A:
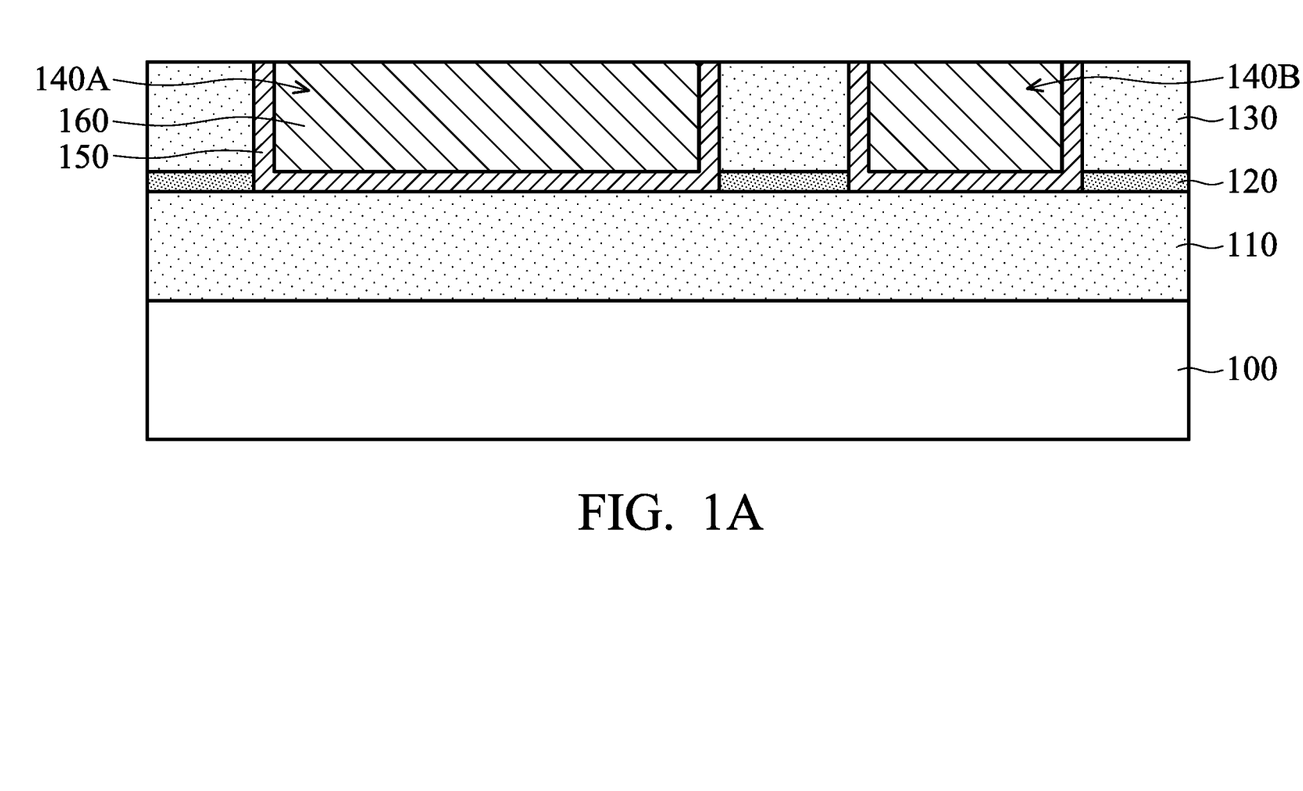
FIGS. 1A-1H are cross-sectional views of various stages of a process for forming a semiconductor device structure, in accordance with some embodiments.

FIGS. 1A-1H are cross-sectional views of various stages of a process for forming a semiconductor device structure, in accordance with some embodiments. As shown in FIG. 1A, a semiconductor substrate 100 is provided. In some embodiments, the semiconductor substrate 100 is a bulk semiconductor substrate, such as a semiconductor wafer. The semiconductor substrate 100 may include silicon or another elementary semiconductor material such as germanium. For example, the semiconductor substrate 100 is a silicon wafer. In some other embodiments, the semiconductor substrate 100 includes a compound semiconductor. The compound semiconductor may include silicon germanium, gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the semiconductor substrate 100. The device elements are not shown in FIGURES for the purpose of simplicity and clarity. Examples of the various device elements include transistors, diodes, another suitable element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the semiconductor substrate 100. The isolation features are used to define active regions and electrically isolate various device elements formed in and/or over the semiconductor substrate 100 in the active regions. In some embodiments, the isolation features include shallow trench isolation (STI) features, local oxidation of silicon (LOCOS) features, other suitable isolation features, or a combination thereof.

In some embodiments, an interconnection structure (which will be described in more detail later) is formed over the semiconductor substrate 100. The interconnection structure includes multiple dielectric layers containing an inter-layer dielectric (ILD) layer and one or more inter-metal dielectric (IMD) layers. The interconnection structure also includes multiple conductive features formed in the ILD and IMD layers. The conductive features may include conductive lines, conductive vias, and/or conductive contacts. Various processes, such as back-end-of-line (BEOL) semiconductor fabrication processes, are performed to form the interconnection structure.

Various device elements are interconnected through the interconnection structure over the semiconductor substrate 100 to form integrated circuit devices. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

More specifically, as shown in FIG. 1A, a dielectric layer 110 is deposited over the semiconductor substrate 100. The dielectric layer 110 may serve as an ILD or IMD layer of an interconnection structure. The dielectric layer 110 covers device elements formed in and/or over the semiconductor substrate 100. Although FIG. 1A shows that the dielectric layer 110 is a single layer, embodiments of the disclosure are not limited thereto. In some other embodiments, the dielectric layer 110 is a multi-layer structure including dielectric sub-layers (not shown).

In some embodiments, the dielectric layer 110 is made of or includes a low dielectric constant (low-k) material, an extreme low-k (ELK) material, silicon oxide, silicon oxynitride, borosilicate glass (BSG), phosphoric silicate glass (PSG), borophosphosilicate glass (BPSG), fluorinated silicate glass (FSG), one or more other suitable materials, or a combination thereof. In some embodiments, the dielectric layer 110 is deposited using a chemical vapor deposition (CVD) process, an atomic layer deposition (ALD) process, a spin-on process, a spray coating process, one or more other applicable processes, or a combination thereof.

The low-k or ELK material may have a smaller dielectric constant than that of silicon dioxide. For example, the low-k material may have a dielectric constant in a range from about 1.5 to about 3.5. The ELK material may have a dielectric constant, which is less than about 2.5 or in a range from about 1.5 to about 2.5. As the density of semiconductor devices increases and the size of circuit elements becomes smaller, the resistance capacitance (RC) delay time increasingly dominates circuit performance. Therefore, using a low-k or ELK material as the dielectric layer 110 is helpful for reducing the RC delay.

A wide variety of low-k or ELK material may be used for forming the dielectric layer 110. In some embodiments, the dielectric layer 110 is made of or includes a porous dielectric material, an organic polymer, an organic silica glass, SiOF series material, a hydrogen silsesquioxane (HSQ) series material, a methyl silsesquioxane (MSQ) series material, carbon doped silicon oxide, amorphous fluorinated carbon, parylene, benzocyclobutenes (BCB), polytetrafluoroethylene (PTFE) (Teflon), silicon oxycarbide polymers (SiOC), a porous organic series material, a spin-on inorganic dielectric, a spin-on organic dielectric, one or more other suitable materials, or a combination thereof.

Multiple conductive features (not shown) are formed in the dielectric layer 110. The conductive features are electrically connected to the device elements. In some embodiments, the conductive features are made of or include copper (Cu), aluminum (Al), tungsten (W), titanium (Ti), cobalt (Co), nickel (Ni), gold (Au), platinum (Pt), one or more other suitable materials, or a combination thereof. Various processes, including deposition, etching, planarization, or the like, may be used to form the conductive features in the dielectric layer 110.

As shown in FIG. 1A, an etching stop layer 120 is deposited over the dielectric layer 110, in accordance with some embodiments. The etching stop layer 120 is used to protect the conductive features in the dielectric layer 110 from being damaged during subsequent etching processes.

In some embodiments, the thickness of the etching stop layer 120 is in a range from about 10 Å to about 100 Å. In some embodiments, the etching stop layer 120 is made of or includes plasma-enhanced oxide (PEOX), tetraethoxysilane (TEOS), silicon carbide (SiC), silicon carbonitride (SiCN), silicon oxycarbide (SiCO), silicon nitride (SiN), silicon oxynitride (SiON), one or more other suitable materials, or a combination thereof. Examples of SiC include oxygen-doped silicon carbide (SiC:O, also known as ODC) and nitrogen-doped silicon carbide (SiC:N, also known as NDC). In some embodiments, the etching stop layer 120 is deposited using a CVD process, a spin-on process, one or more other suitable materials, or a combination thereof. Embodiments of the disclosure have many variations. In some other embodiments, the etching stop layer 120 is not formed.

As shown in FIG. 1A, a dielectric layer 130 is deposited over the etching stop layer 120, in accordance with some embodiments. The dielectric layer 130 serves as an IMD layer of an interconnection structure. In some embodiments, the dielectric layer 130 is made of or includes a low-k material, an ELK material, silicon oxide, silicon oxynitride, BSG, PSG, BPSG, FSG, one or more other suitable materials, or a combination thereof. Using a low-k or ELK material as the dielectric layer 130 is helpful for reducing the RC delay. In some embodiments, the dielectric layer 130 is deposited using a CVD process, an ALD process, a spin-on process, a spray coating process, one or more other applicable processes, or a combination thereof.

Multiple conductive features are formed in the dielectric layer 130 and the etching stop layer 120, in accordance with some embodiments. Conductive features 140A and 140B are shown in FIG. 1A as an example. The conductive feature 140A is wider than the conductive feature 140B. It should be noted that the dimensions of the conductive features 140A and 140B shown in FIG. 1A are only an example and not a limitation to the disclosure. The conductive features 140A and 140B may be single or dual damascene structures. The conductive features 140A and 140B are electrically connected to the device elements through the conductive features (not shown) in the dielectric layer 110.

For example, in some embodiments, a patterned hard mask (not shown) is formed over the dielectric layer 130. Afterwards, one or more etching processes are performed over the patterned hard mask to partially remove the dielectric layer 130. As a result, openings (not shown), such as trenches, are formed in the dielectric layer 130. The patterned hard mask is then removed. As mentioned above, the etching stop layer 120 protects the conductive features in the dielectric layer 110 from being damaged during the etching process for forming the openings.

The etching stop layer 120 is partially removed such that the conductive features (not shown) in the dielectric layer 110 become exposed through the openings. The etching stop layer 120 may be partially removed during or after the removal of the patterned hard mask. Afterwards, a barrier layer 150 and a conductive layer 160 are deposited over the dielectric layer 130 and fill up the openings. A planarization process is used to remove portions of the barrier layer 150 and the conductive layer 160 outside of the openings. The planarization process may include a chemical mechanical polishing (CMP) process, a dry polishing process, a grinding process, an etching process, one or more other applicable processes, or a combination thereof. As a result, the remaining portions of the barrier layer 150 and the conductive layer 160 in the openings form the conductive features 140A and 140B, as shown in FIG. 1A.

The barrier layer 150 can protect the dielectric layer 130 from diffusion of a metal material from the conductive layer 160 during subsequent thermal processes or cycles. In some embodiments, the barrier layer 150 is made of or includes tantalum nitride, titanium nitride, tungsten nitride, one or more other suitable materials, or a combination thereof. In some embodiments, the barrier layer 150 is deposited using a physical vapor deposition (PVD) process, a CVD process, an ALD process, one or more other applicable processes, or a combination thereof. In some embodiments, the barrier layer 150 is deposited uniformly. Many variations and/or modifications can be made to embodiments of the disclosure. In some other embodiments, the barrier layer 150 is not formed.

In some embodiments, the conductive layer 160 is made of or includes Cu, Co, Ru, Al, W, Ti, Ni, Au, Pt, one or more other suitable materials, or a combination thereof. In some embodiments, the conductive layer 160 is deposited using an electroplating process, a PVD process, a CVD process, an electroless plating process, one or more other applicable processes, or a combination thereof.

Although FIG. 1A shows that the conductive layer 160 is a single layer, embodiments of the disclosure are not limited thereto. The conductive layer 160 may be a multi-layer structure including conductive sub-layers. For example, the conductive sub-layers include a metal-filling layer, a seed layer, one or more other suitable layers, or a combination thereof. The conductive sub-layers are not shown in FIGURES for the purpose of simplicity and clarity.

Figure 1B:
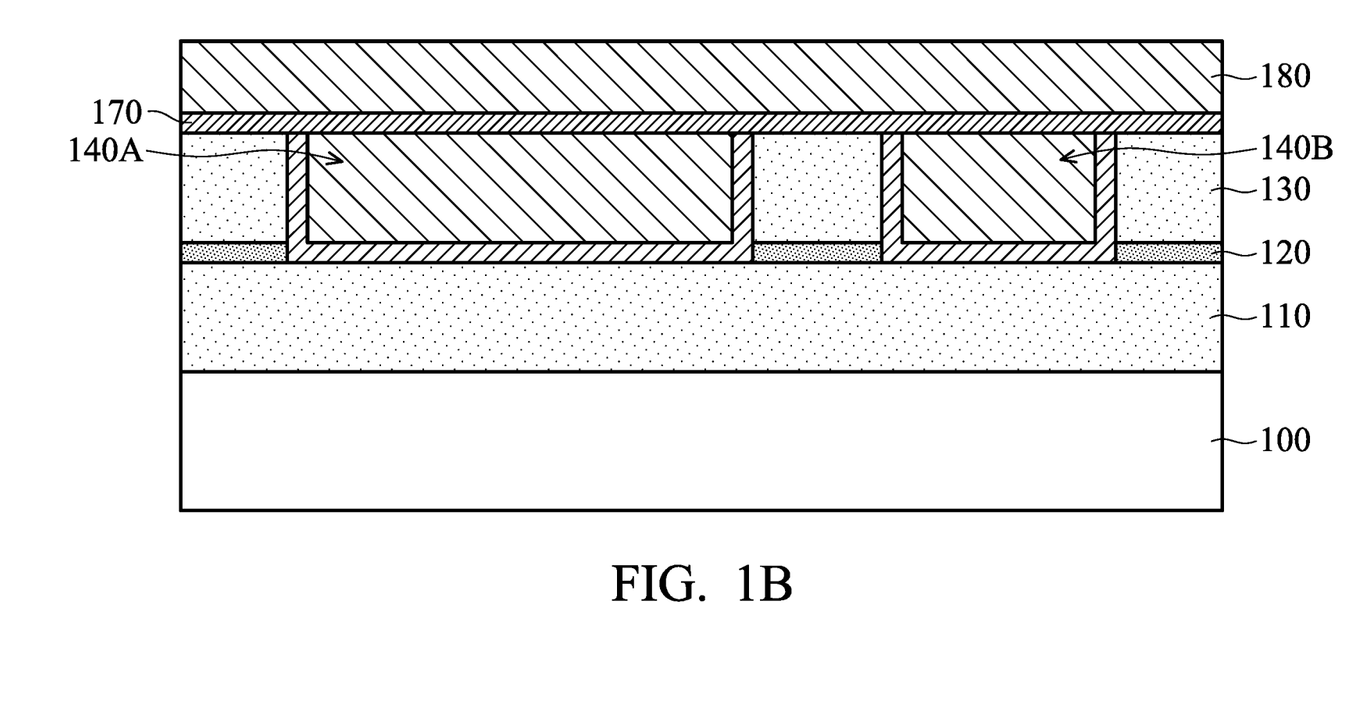

As shown in FIG. 1B, an etching stop layer 170 is deposited over the dielectric layer 130, in accordance with some embodiments. The etching stop layer 170 covers the conductive features 140A and 140B. The etching stop layer 170 is used to protect the conductive features 140A and 140B from being damaged during subsequent etching processes.

In some embodiments, the thickness of the etching stop layer 170 is in a range from about 10 Å to about 100 Å. The etching stop layer 170 and the etching stop layer 120 are made of different materials. In some embodiments, the etching stop layer 170 is made of a conductive material to provide electrical connection in the interconnection structure. In some embodiments, the etching stop layer 170 is made of or includes metal, metal alloy, graphene, one or more other suitable materials, or a combination thereof. For example, the etching stop layer 170 is made of or includes Al, Cu, Ti, one or more other suitable materials, or alloy thereof. Graphene may be referred to as a semi-metal material. That is, although graphene is not metal, graphene provides metal-like characteristics, such as electrical conductivity properties comparable to metal.

In some embodiments, the etching stop layer 170 is deposited using a CVD process, a PVD process, an ALD process, an electroplating process, an electroless plating process, one or more other applicable processes, or a combination thereof. The etching stop layer 170 including graphene may be deposited using diffusion-assisted synthesis or an epitaxial growth process.

As shown in FIG. 1B, a conductive layer 180 is deposited over the etching stop layer 170, in accordance with some embodiments. In some embodiments, the thickness of the conductive layer 180 is in a range from about 200 Å to about 1000 Å. The conductive layer 180 is thicker than the etching stop layer 170.

In some embodiments, the conductive layer 180 is made of or includes Ru, Cu, Co, W, Al, one or more other suitable materials, or a combination thereof. In some embodiments, the conductive layer 180 and the etching stop layer 170 are made of or include different materials with different etching resistance. In some embodiments, the conductive layer 180 is deposited using an electroplating process, a PVD process, a CVD process, an electroless plating process, one or more other applicable processes, or a combination thereof. The conductive layer 180 may include a seed layer, which is not shown in FIGURES for the purpose of simplicity and clarity.

Figure 1C:
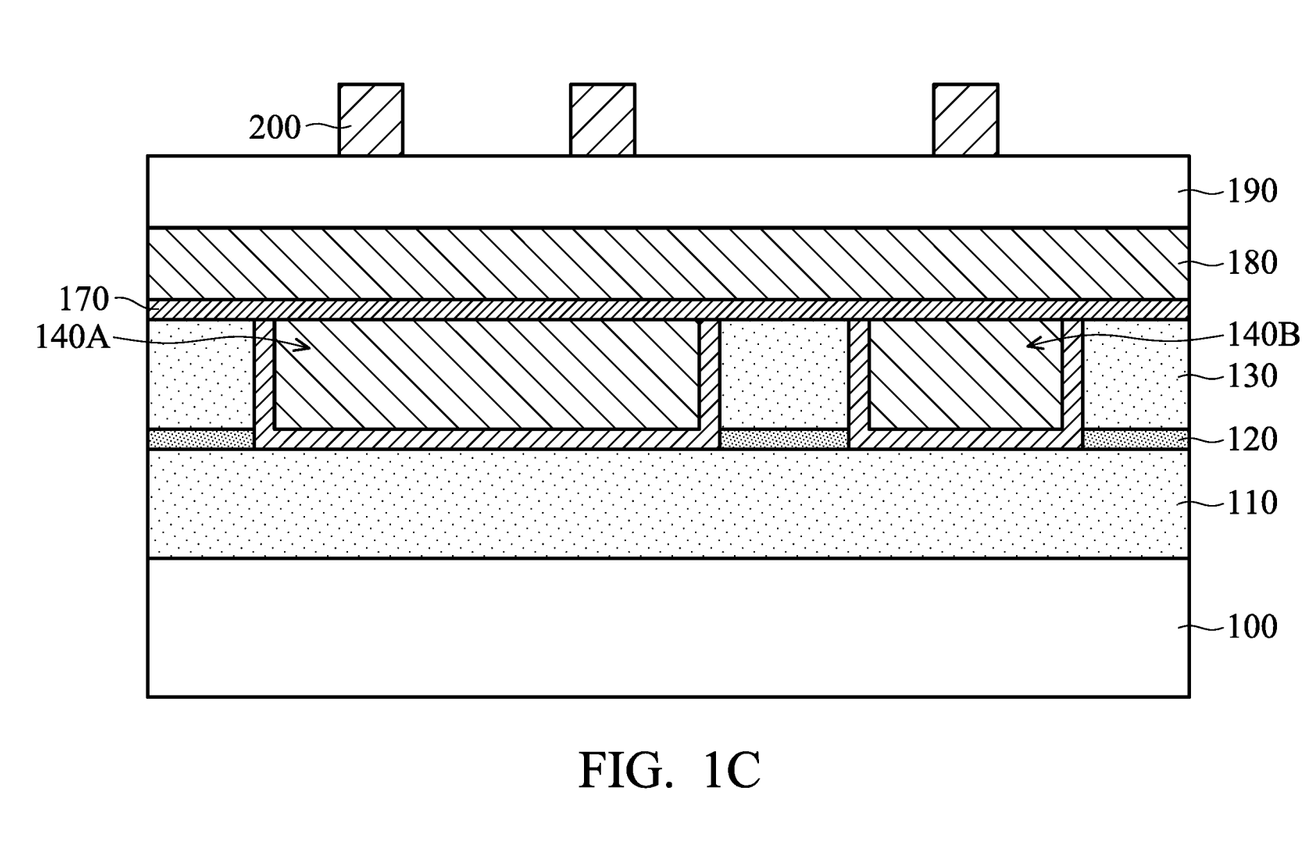

As shown in FIG. 1C, a hard mask 190 is deposited over the conductive layer 180, in accordance with some embodiments. In some embodiments, the hard mask 190 is made of or includes silicon oxide, silicon nitride, silicon oxynitride, silicon carbide, one or more other suitable materials, or a combination thereof. In some other embodiments, the hard mask 190 is a multi-layer structure, such as oxide-nitride-oxide (ONO) layers. In some embodiments, the hard mask 190 is deposited using a PVD process, a CVD process, an ALD process, one or more other applicable processes, or a combination thereof.

As shown in FIG. 1C, a patterned mask layer 200 is formed over the hard mask 190, in accordance with some embodiments. The mask layer 200 defines the pattern of conductive vias, which will subsequently be formed over the conductive features 140A and 140B. The mask layer 200 may be a photoresist (PR) or photo-sensitive layer and is patterned using a photolithography process. The mask layer 200 may be negative type or positive type.

In some embodiments, the mask layer 200 is made of or includes polyimide, metal-containing organic-inorganic hybrid compound, one or more other suitable materials, or a combination thereof. Examples of the metal-containing organic-inorganic hybrid compound may include metal-containing oxide (such as $ZrO_x$ or $TiO_x$) or another organic-inorganic hybrid compound.

As the density of semiconductor devices increases and the size of circuit elements becomes smaller, the resolution in a photolithography process increasingly becomes important and extreme ultraviolet (EUV) radiation is widely used. Using metal-containing organic-inorganic hybrid compound as the mask layer 200 is helpful for enhancing the resolution in a photolithography process and is suitable for EUV radiation.

Although FIG. 1C shows that the mask layer 200 is a single layer, embodiments of the disclosure are not limited thereto. In some other embodiments, the mask layer 200 is a multi-layer structure including sub-layers (not shown). For example, the mask layer 200 may include a bottom layer, a middle layer, and a top PR layer.

Figure 1D:
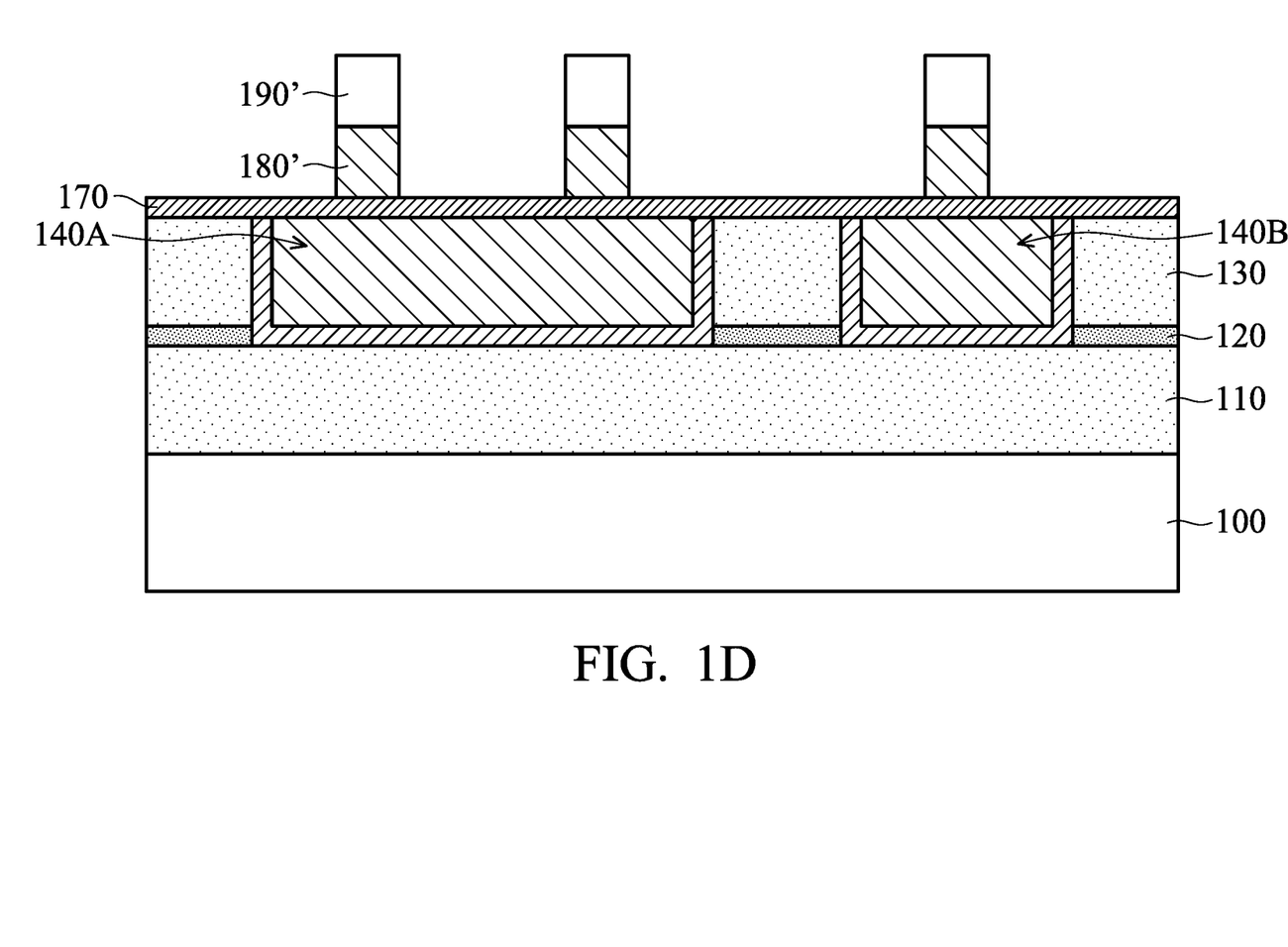

Afterwards, one or more etching processes (such as a dry etching process and/or a wet etching process) are performed over the mask layer 200. The hard mask 190 is etched such that a patterned hard mask 190' is formed, as shown in FIG. 1D. As a result, the pattern of conductive vias is transferred to the hard mask 190'. The mask layer 200 is then removed or stripped.

Subsequently, one or more etching processes are performed over the hard mask 190'. The conductive layer 180 is etched and patterned such that multiple conductive pillars 180' are formed, as shown in FIG. 1D. The conductive layer 180 is etched using a dry etching process, a wet etching process, or a combination thereof. For example, in some embodiments, the conductive layer 180 is etched using a reactive ion etching (RIE) process. The etchant used in the etching processes may include $C_xCl_y$, $C_xH_yOH$, $Cl_2$, $C_xF_y$, CO, BCl$_3$, SiCl$_4$, F$_2$, NF$_3$, CF$_4$, SF$_6$, H$_2$, N$_2$, one or more other suitable etchants, or a combination thereof. As mentioned above, the etching stop layer 170 protects the conductive features 140A and 140B from being damaged during the etching process for forming the conductive pillars 180'.

In some embodiments, the conductive pillars 180' have substantially vertical sidewalls. However, embodiments of the disclosure are not limited thereto. In some other embodiments, the conductive pillars 180' have inclined sidewalls. The cross-sectional profile of the conductive pillars 180' may be rectangular, square, or another shape. The horizontal profile of the conductive pillars 180' may be relatively rounded, circular, rectangular, square, or another shape.

Figure 1E:
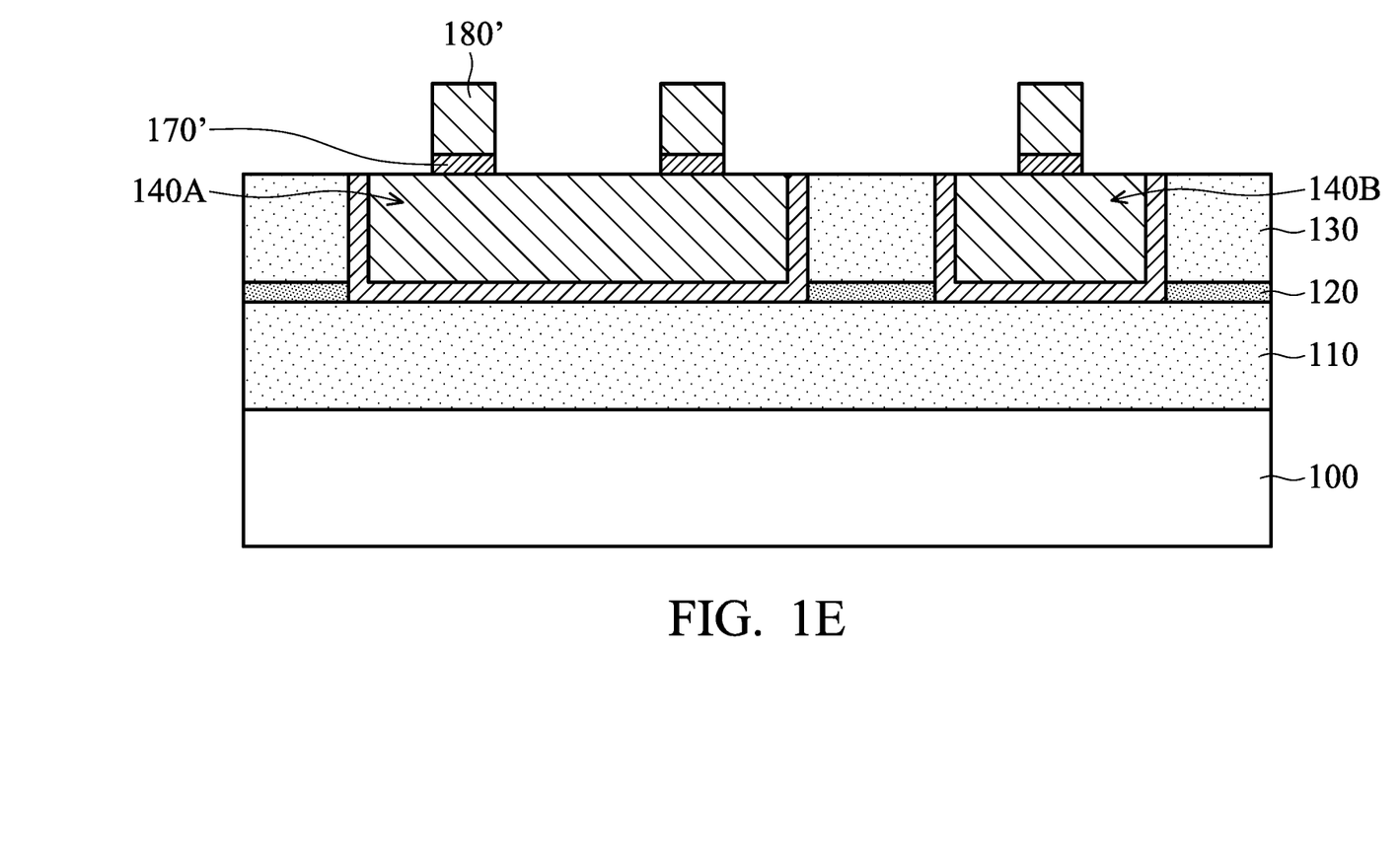

Afterwards, one or more etching processes (such as a dry etching process and/or a wet etching process) are performed over the conductive pillars 180'. The etching stop layer 170 is etched such that a patterned etching stop layer 170' is formed, as shown in FIG. 1E. The etchant for patterning the etching stop layer 170 may include C$_x$Cl$_y$, C$_x$H$_y$OH, Cl$_2$, C$_x$F$_y$, CO, BCl$_3$, SiCl$_4$, F$_2$, NF$_3$, CF$_4$, SF$_6$, H$_2$, N$_2$, one or more other suitable etchants, or a combination thereof.

In some embodiments, the etching stop layer 170 is made of or includes metal or metal alloy. The etching stop layer 170 is etched using an etchant which includes fluorine (F), F-containing gas, chlorine (Cl$_2$), Cl-containing gas, one or more other suitable etchants, or a combination thereof. Many variations and/or modifications can be made to embodiments of the disclosure. In some other embodiments, the etching stop layer 170 is made of or includes graphene. The etching stop layer 170 is etched using an etchant which includes oxygen (O$_2$), O-containing gas, one or more other suitable etchants, or a combination thereof.

In some embodiments, the conductive pillars 180' are used as an etching mask during the etching process. As a result, the etching stop layer 170' has a pattern corresponding to the conductive pillars 180'. The etching stop layer 170' and the conductive pillars 180' have substantially the same horizontal profile. In some embodiments, the sidewalls of the etching stop layer 170' are substantially coplanar with the sidewalls of the conductive pillars 180'.

The conductive features 140A and 140B and the dielectric layer 130 become exposed during and after the patterning of the etching stop layer 170. In some embodiments, the hard mask 190' is removed during the patterning of the etching stop layer 170. However, embodiments of the disclosure are not limited. In some other embodiments, the hard mask 190' is removed or stripped before the patterning of the etching stop layer 170.

Figure 1F:
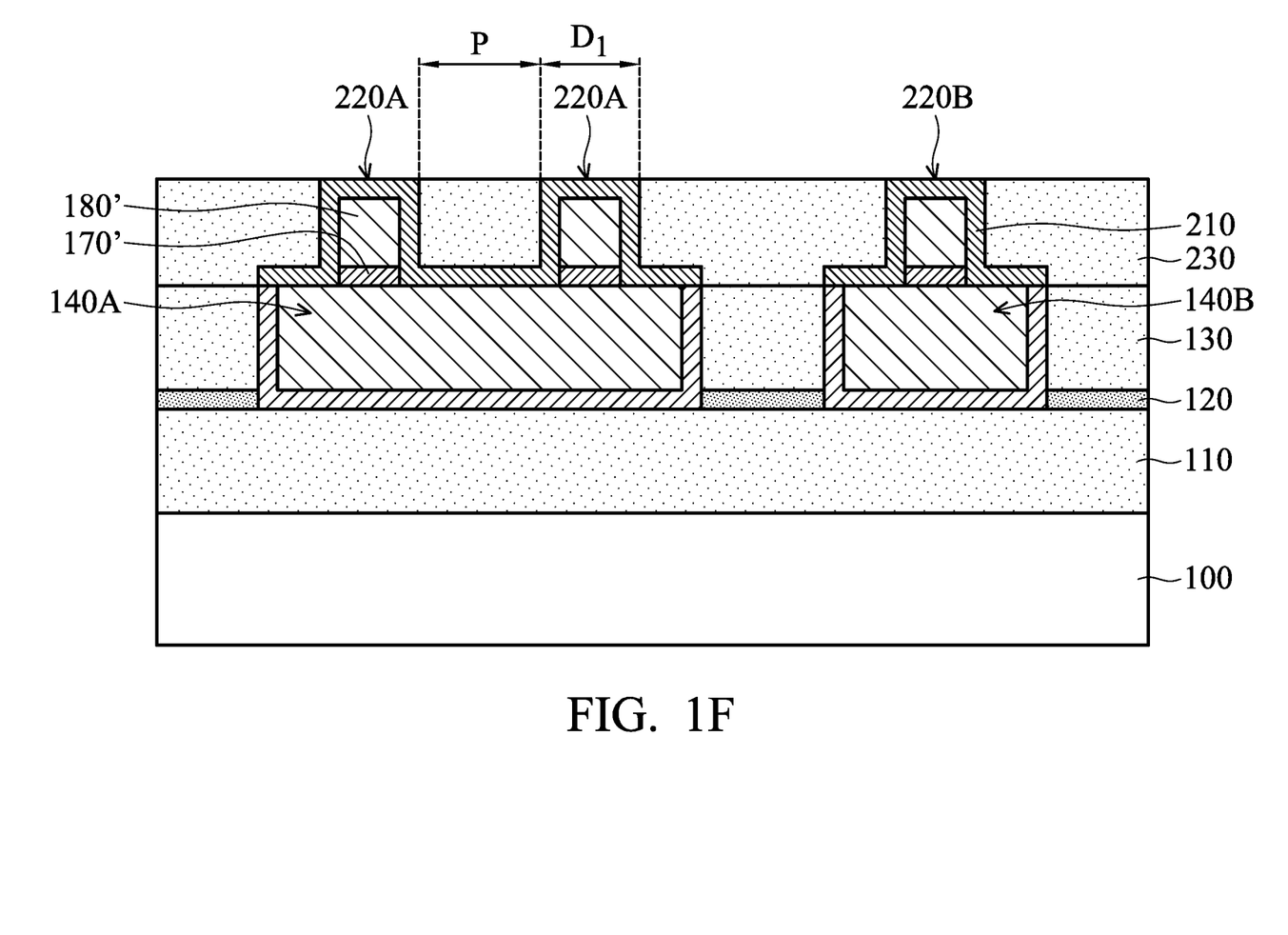

As shown in FIG. 1F, a capping layer 210 is deposited over the conductive pillars 180', in accordance with some embodiments. The capping layer 210 is used to improve the reliability of the conductive pillars 180' (which will be described in more detail later). The capping layer 210 may serve as a barrier layer, which can protect a subsequently formed dielectric layer from diffusion of a metal material from the conductive pillars 180' during subsequent thermal processes or cycles. High resistance, current leakage or short circuiting, which may be induced by metal diffusion or electron migration, is reduced or eliminated. Therefore, the semiconductor device structure has improved device performance (e.g., improved electro-migration (EM) characteristics) and reliability.

In some embodiments, the capping layer 210 covers and adjoins the top surface and the sidewalls of the conductive pillars 180'. The capping layer 210 also covers and adjoins the sidewalls of the pattern of the etching stop layer 170'.

In some embodiments, the thickness of the capping layer 210 is in a range from about 10 Å to about 50 Å. In some embodiments, the capping layer 210 is made of or includes a metal material. For example, the capping layer 210 is made of or includes Co, Mn, Ru, one or more other suitable materials, or a combination thereof. The capping layer 210 made of Co, Mn or Ru can prevent metal diffusion or electron migration. In some embodiments, the capping layer 210 is made of or includes a diffusion barrier material. For example, the capping layer 210 is made of or includes Ta or TaN. In some embodiments, the capping layer 210 made of Co, Mn or Ru has a lower electrical resistance than the capping layer 210 made of Ta or TaN.

In some embodiments, the capping layer 210 is deposited using an ALD process, an electroplating process, an electroless plating process one or more other applicable processes, or a combination thereof. In some embodiments, the capping layer 210 is formed using a self-aligned process. For example, a metal material is conformally deposited over the metal-containing surfaces (such as the surfaces of the conductive features 140A and 140B, the etching stop layer 170', and the conductive pillars 180') to form the capping layer 210. The metal material spontaneously aligns the metal-containing surfaces and is substantially not deposited over the surface of the dielectric layer 130. Accordingly, the formation of the capping layer 210 does not require lithography patterning processes. The capping layer 210 does not overlap the dielectric layer 130.

Many variations and/or modifications can be made to embodiments of the disclosure. In some other embodiments, a diffusion barrier material is conformally deposited and then is patterned to form the capping layer 210 using lithography and etching processes. The capping layer 210 between the conductive pillars 180' may be etched to separate from each other.

In some embodiments, a thermal process is performed after the deposition of the capping layer 210. As a result, metal atoms in the capping layer 210 are drafted into the conductive pillars 180'. The metal atoms from the capping layer 210 fix or strengthen the bonds between metal atoms (such as Cu or Al) in the conductive pillars 180'. Therefore, the conductive pillars 180' can be prevented from being pulled to break when the semiconductor device operates and currents flow through the conductive pillars 180'. The capping layer 210 improves the reliability of the conductive pillars 180'.

In accordance with some embodiments, the capping layer 210, the conductive pillars 180', and the etching stop layer 170' together form multiple conductive vias 220A and 220B, as shown in FIG. 1F. One or more conductive vias 220A are physically and electrically connected to the conductive feature 140A. One or more conductive vias 220B are physically and electrically connected to the conductive feature 140B.

Many variations and/or modifications can be made to embodiments of the disclosure. In some other embodiments, the capping layer 210 is not formed. As a result, each of conductive vias 220A and 220B is made of the conductive pillars 180' and the etching stop layer 170'.

The conductive vias 220A and 220B may be the same dimension, but embodiments of the disclosure are not limited thereto. The conductive vias 220A and 220B have a dimension D$_1$ (such as diameter or width). In some embodiments, the dimension D$_1$ is in a range from about 10 nm to about 30 nm. The conductive vias 220A and 220B have a pitch P. In some embodiments, the pitch P is in a range from about 10 nm to about 30 nm. These ranges are only examples and are not a limitation to the disclosure.

Afterwards, a dielectric layer 230 is deposited over the capping layer 210 and the dielectric layer 130, as shown in FIG. 1F in accordance with some embodiments. The dielectric layer 230 serves as an IMD layer of an interconnection structure. The dielectric layer 230 surrounds the conductive vias 220A and 220B and fills between the conductive vias 220A and 220B.

In some embodiments, the dielectric layer 230 is in direct contact with the dielectric layer 130 since the etching stop layer 170 is etched into the patterned etching stop layer 170'. In some embodiments, the interface between the dielectric layer 130 and the dielectric layer 230 is substantially coplanar with the interface between the etching stop layer 170' and the conductive features 140A or 140B. In some embodiments, the interface between the dielectric layer 130 and the dielectric layer 230 is substantially coplanar with the interface between the capping layer 210 and the conductive features 140A or 140B. In some embodiments, the capping layer 210 separates the dielectric layer 230 from the conductive pillars 180', the etching stop layer 170', and the conductive features 140A and 140B including the barrier layer 150 and the conductive layer 160.

In some embodiments, the dielectric layer 230 is made of or includes a low-k material, an ELK material, silicon oxide, silicon oxynitride, BSG, PSG, BPSG, FSG, one or more other suitable materials, or a combination thereof. Using a low-k or ELK material as the dielectric layer 230 is helpful for reducing the RC delay. In some embodiments, the dielectric layer 230 is deposited using a CVD process, an ALD process, a spin-on process, a spray coating process, one or more other applicable processes, or a combination thereof.

The deposited dielectric layer 230 covers the conductive vias 220A and 220B. A planarization process is subsequently performed to thin down the deposited dielectric layer 230 until the conductive vias 220A and 220B are exposed, as shown in FIG. 1F. The planarization process may include a CMP process, a grinding process, an etching process, one or more other applicable processes, or a combination thereof. The capping layer 210 of the conductive vias 220A and 220B may be used as a polishing stop layer during the CMP process.

In some cases, a dielectric layer is etched to form via holes using a single damascene process or to form via holes and trenches using a dual damascene process. A conductive material is then deposited to form conductive features in the via holes and/or the trenches of the dielectric layer. During the etching of the dielectric layer, some portions of the dielectric layer, which are near the via holes and/or the trenches, may be modified or slightly damaged. For example, the dielectric layer may include carbon and the etchant used in the etching of the dielectric layer may include oxygen. As a result, carbon in some portions of the dielectric layer may be oxidized during the etching of the dielectric layer. Voids or vacancies may be formed in the etched dielectric layer. Since the carbon concentration is reduced, the dielectric constant of some portions of the dielectric layer is increased such that the capacitance may be increased.

A microscope or spectrometer may be used to observe and analyze the modifying status or measure the change of carbon concentration. The microscope may include a transmission electron microscope (TEM) or another suitable microscope. The spectrometer may include an electron energy loss spectrometer (EELS) or another suitable spectrometer.

In addition, when a conductive material is deposited to form the conductive features, the dielectric layer may be pushed and pressed. As a result, in some cases, the dielectric layer may be damaged. For example, cracks or deformation may be induced in the dielectric layer during the deposition of the conductive material. If the conductive material does not have sufficiently good gap-filling ability or the aspect ratio of the via holes and/or the trenches is high, the conductive material may surround voids or vacancies in the via holes and/or the trenches.

In accordance with some embodiments, the conductive vias 220A and 220B are formed using lithography patterning processes before the deposition of the dielectric layer 230. The dimensions (such as the minimum width) and/or pitch of the conductive vias 220A and 220B can be reduced even further. There is substantially no void or vacancy formed during the formation of the conductive vias 220A and 220B. Alignment in the lithography patterning processes is simple, such as being simpler than a dual damascene process.

Since the dielectric layer 230 is deposited after the formation of the conductive vias 220A and 220B, the dielectric layer 230 does not need to be etched. As a result, the dielectric layer 230 is not modified or damaged. In some embodiments, a TEM or an EELS is used to analyze the dielectric layer 230, in particular to some portions adjoining the conductive vias 220A and 220B. The carbon concentration of the dielectric layer 230 is substantially not changed after the formation of the conductive features 140A and 140B and before the formation of conductive features 260 shown in FIG. 1H (which will be described in more detail later). Accordingly, the dielectric constant of the dielectric layer 230 maintains substantially the same. It can be ensured that the capacitance keeps sufficiently low. As a result, the RC delay time is reduced. The operation speed of the semiconductor device structure is increased.

Furthermore, the dielectric layer 230 is also prevented from being physically damaged, such as cracks or deformation, since the conductive vias 220A and 220B is formed before the deposition of the dielectric layer 230. A more reliable interconnection structure can be provided. Therefore, the semiconductor device structure has improved device performance and reliability.

In addition, since the conductive vias 220A and 220B are formed using lithography patterning processes before the deposition of the dielectric layer 230, the semiconductor device structure has a more uniform topography. It becomes more flexible to choose a mask layer (such as the mask layer 200) used in a lithography process. For example, a tri-layer mask layer may be replaced by a single mask layer.

Figure 1G:
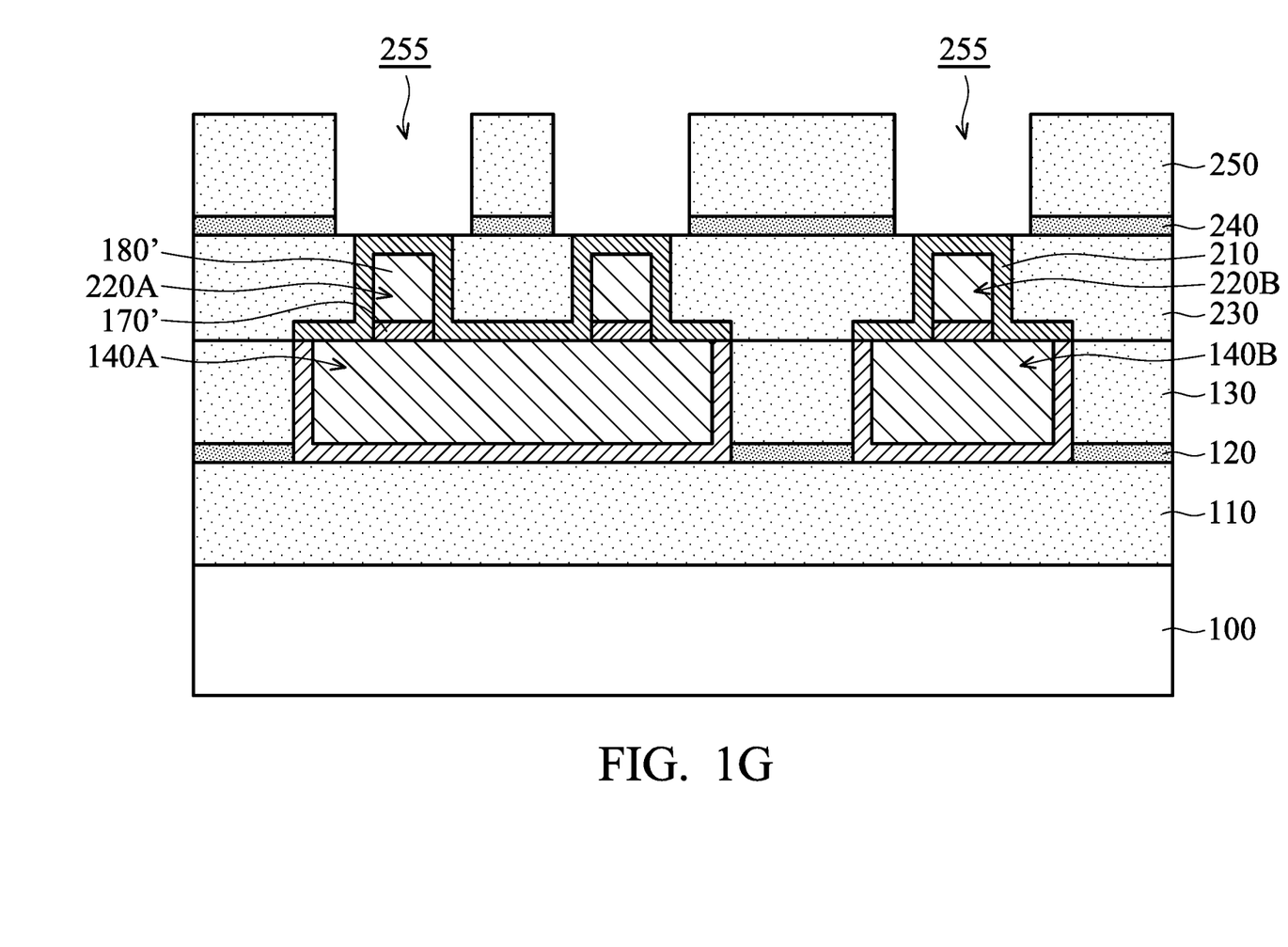

Afterwards, the same or similar steps as those described in FIG. 1A are performed over the structure shown in FIG. 1F, in accordance with some embodiments. As a result, as shown in FIG. 1G, an etching stop layer 240 is deposited over the dielectric layer 230, and a dielectric layer 250 is deposited over the etching stop layer 240. The materials and/or formation methods of the etching stop layer 240 and the dielectric layer 250 are the same as or similar to those of the etching stop layer 120 and the dielectric layer 130, as illustrated in the aforementioned embodiments, and therefore are not repeated. In some embodiments, the etching stop layer 240 is sandwiched between the dielectric layer 250 and the dielectric layer 230.

As described in FIG. 1A, one or more etching processes are performed to partially remove the dielectric layer 250.

As a result, multiple trenches 255 are formed in the dielectric layer 250, as shown in FIG. 1G. The etching stop layer 240 protects the conductive vias 220A and 220B from being damaged during the etching process for forming the trenches 255.

Afterwards, the etching stop layer 240 is partially removed such that the trenches 255 extend to the conductive vias 220A and 220B, as shown in FIG. 1G. The conductive vias 220A and 220B (such as the capping layer 210) are exposed through the trenches 255. In some embodiments, one of the trenches 255 is wider than one of the conductive vias 220A and 220B (such as the conductive pillars 180' and/or the etching stop layer 170'). As a result, the dielectric layer 230 is partially exposed through the trenches 255. For example, a portion of the dielectric layer 230 adjacent to the conductive vias 220A and 220B (such as the capping layer 210) is exposed through the trenches 255.

In accordance with some embodiments, the trenches 255 are formed after the formation of the conductive vias 220A and 220B. Accordingly, the steps described in FIGS. 1A-1G may be also referred to as a via-first process or single damascene processes. Since the trenches 255 are formed separately from the conductive vias 220A and 220B, the trenches 255 have a relatively low aspect ratio (such as in a range from about 1 to about 4). For example, compared to a dual damascene process, the trenches 255 have a lower aspect ratio. It becomes easier to deposit one or more conductive materials in the trenches 255 (which will be described in more detail later). As a result, there is substantially no void or vacancy formed in the trenches 255 during the deposition of the conductive materials. The conductive materials in the trenches 255 form conductive features which are more reliable and have a lowered electrical resistance. Therefore, the semiconductor device structure has enhanced device performance and reliability.

Figure 1H:
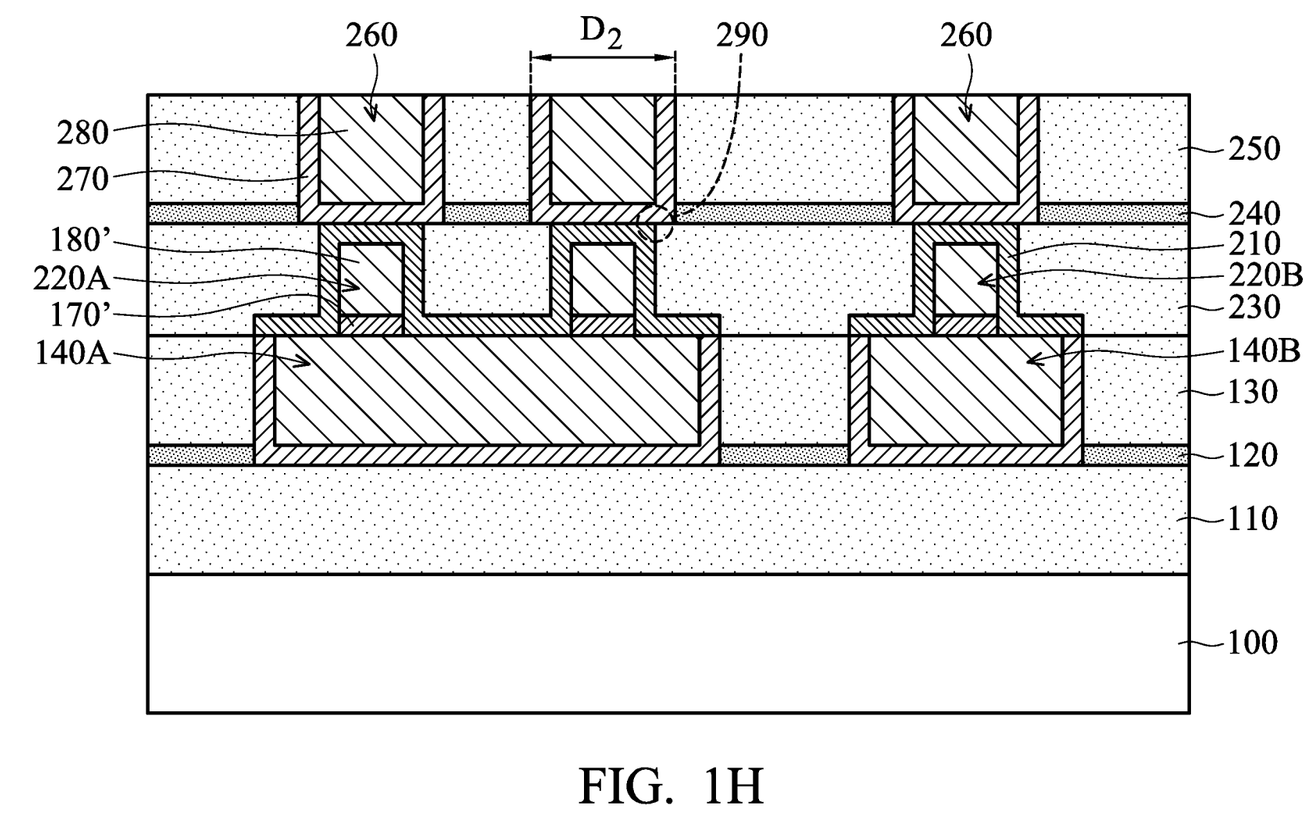

More specifically, multiple conductive features 260 (such as conductive lines) are formed in the trenches 255, as shown in FIG. 1H in accordance with some embodiments. A barrier layer 270 and a conductive layer 280 are deposited over the dielectric layer 250 and fill up the trenches 255. The materials and/or formation methods of the barrier layer 270 and the conductive layer 280 are the same as or similar to those of the barrier layer 150 and the conductive layer 160, as illustrated in the aforementioned embodiments, and therefore are not repeated.

A planarization process is then performed to remove portions of the barrier layer 270 and the conductive layer 280 outside of the trenches 255. The planarization process may include a CMP process, a dry polishing process, a grinding process, an etching process, one or more other applicable processes, or a combination thereof. As a result, the remaining portions of the barrier layer 270 and the conductive layer 280 in the trenches 255 form the conductive features 260, as shown in FIG. 1H. The conductive features 260 are electrically connected to the conductive features 140A and 140B through the conductive vias 220A and 220B. In some embodiments, the barrier layer 270 adjoins the dielectric layer 250, the etching stop layer 240, the dielectric layer 230, and the conductive vias 220A and 220B.

The conductive features 260 have a dimension $D_2$ (such as diameter or width). In some embodiments, the dimension $D_2$ is in a range from about 10 nm to about 30 nm, but embodiments of the disclosure are not limited. In some embodiments, the dimension $D_2$ of the conductive features 260 is greater than the dimension $D_1$ of the conductive vias 220A and 220B. Accordingly, there is a corner between one of the conductive features 260 and one of the conductive vias 220A and 220B. The dielectric layer 230 fills the corner.

For example, a corner 290 (shown by dashed circle in FIG. 1H) is between the bottom surface of the conductive feature 260 and the sidewall of the conductive via 220A. In other words, a portion of the conductive feature 260 extends outwardly from the sidewall of the conductive via 220A and overlies the dielectric layer 230. The angle of the corner 290 may be fine-tuned to meet requirements.

In some embodiments, the interface between one of the conductive features 260 and one of the conductive vias 220A and 220B (such as the interface between the barrier layer 270 and the capping layer 210) is substantially coplanar with the interface between one of the conductive features 260 and the dielectric layer 230. In some embodiments, the interface between one of the conductive features 260 and one of the conductive vias 220A and 220B is substantially coplanar with the interface between the etching stop layer 240 and the dielectric layer 230.

In some embodiments, one of the conductive features 260 is narrower than one of the conductive features 140A and 140B. In some embodiments, the dimension $D_2$ of the conductive features 260 is greater than the dimension $D_1$ of the conductive vias 220A and 220B and is less than the dimension of the conductive features 140A and 140B. In some embodiments, the pitch between the conductive features 260 is less than the pitch P between the conductive vias 220A and 220B, as shown in FIG. 1H.

Many variations and/or modifications can be made to embodiments of the disclosure. In some other embodiments, the dimension $D_2$ of the conductive features 260 is substantially the same as the dimension $D_1$ of the conductive vias 220A and 220B. Accordingly, there is no corner between the conductive features 260 and the conductive vias 220A and 220B.

In some embodiments, the capping layer 210 covers the sidewalls of the conductive pillars 180' and the etching stop layer 170'. A portion of the capping layer 210 extends between the conductive pillars 180' and the conductive features 260, and may be sandwiched between the conductive pillars 180' and the barrier layer 270. Another portion of the capping layer 210 extends from the sidewalls of the etching stop layer 170' until it substantially aligns with the sidewalls of the conductive features 140A or 140B. In other words, the capping layer 210 forms L-shaped or stepped portions around the sidewalls of the conductive pillars 180' and the etching stop layer 170', as shown in FIG. 1H.

Afterwards, one or more dielectric layers, multiple conductive vias, and multiple conductive features are formed over the dielectric layer 250 and the conductive features 260 to continue the formation of the interconnection structure of the semiconductor device structure. In some embodiments, the operations illustrated in FIGS. 1B-1H are repeated one or more times to continue the formation of the interconnection structure.

For example, an upper conductive layer, which may be the same as or similar to the conductive layer 180, may be deposited to cover the dielectric layer 250 and the conductive features 260. The upper conductive layer is then patterned to form conductive vias. Afterwards, an upper dielectric layer is deposited to surround the conductive vias. In some embodiments, another etching stop layer, which is the same as or similar to the etching stop layer 170, is deposited over the dielectric layer 250 and the conductive features 260 before the deposition of the upper conductive layer. In some embodiments, another capping layer, which is the same as or similar to the capping layer 210, is deposited to cover the upper conductive layer before the deposition of the upper dielectric layer.

In some embodiments, the formation method shown in FIGS. 1A-1H is used to form an interconnection structure of a semiconductor device. However, embodiments of the disclosure are not limited. In some other embodiments, the formation method described in the disclosure can be used to form any suitable conductive via between two bulk conductive structures at different levels.

Embodiments of the disclosure can be applied to not only a semiconductor device structure with planar FETs but also a semiconductor device structure with FinFETs or other applicable devices. Embodiments of the disclosure are not limited and may be applied to fabrication processes for any suitable technology generation. Various technology generations include a 28 nm node, a 20 nm node, a 16 nm node, a 10 nm node, a 7 nm node, a 5 nm node, a 3 nm node, or another suitable node.

Embodiments of the disclosure provide structures and formation methods of a semiconductor device structure. The semiconductor device structure includes a conductive via between a first conductive feature in an underlying dielectric layer and a second conductive feature in an overlying dielectric layer. The conductive via is surrounded by a middle dielectric layer between the underlying dielectric layer and the overlying dielectric layer. The conductive via is formed using lithography patterning processes before the deposition of the middle dielectric layer. It becomes flexible to control the dimension of the conductive via. The dimension of the conductive via can be reduced even further. The middle dielectric layer can be prevented from being modified or damaged. It can be ensured that the capacitance keeps sufficiently low. As a result, the RC delay time is reduced so the operation speed is increased. Therefore, the semiconductor device structure has improved device performance and reliability.

In accordance with some embodiments, a semiconductor device structure is provided. The semiconductor device structure includes a first dielectric layer over a semiconductor substrate. The semiconductor device structure also includes a first conductive feature in the first dielectric layer. The semiconductor device structure further includes a second conductive feature over the first dielectric layer. In addition, the semiconductor device structure includes a conductive via between the first conductive feature and the second conductive feature. The conductive via includes an etching stop layer over the first conductive feature, a conductive pillar over the etching stop layer, and a capping layer surrounding the conductive pillar and the etching stop layer. The first conductive feature and the second conductive feature are electrically connected to each other through the capping layer, the conductive pillar, and the etching stop layer. The semiconductor device structure also includes a second dielectric layer over the first dielectric layer and below the second conductive feature. The second dielectric layer surrounds the conductive via.

In accordance with some embodiments, a semiconductor device structure is provided. The semiconductor device structure includes a first dielectric layer over a semiconductor substrate. The semiconductor device structure also includes a first conductive feature in the first dielectric layer. The semiconductor device structure further includes a second dielectric layer over the first dielectric layer. In addition, the semiconductor device structure includes a conductive via surrounded by the second dielectric layer. The semiconductor device structure also includes an etching stop layer over the second dielectric layer. The semiconductor device structure further includes a third dielectric layer over the etching stop layer. Furthermore, the semiconductor device structure includes a second conductive feature in the third dielectric layer and the etching stop layer. The first conductive feature and the second conductive feature are electrically connected to each other through the conductive via. The second dielectric layer adjoins the first dielectric layer and fills the corner between the conductive via and the second conductive feature.

In accordance with some embodiments, a method for forming a semiconductor device structure is provided. The method includes depositing a first etching stop layer over a first dielectric layer. The first etching stop layer covers a first conductive feature in the first dielectric layer. The method also includes depositing a conductive layer over the first etching stop layer. The method further includes etching the conductive layer to form a conductive pillar. In addition, the method includes etching the first etching stop layer using the conductive pillar as an etching mask. The method also includes forming a second dielectric layer surrounding the conductive pillar after the etching of the first etching stop layer. The method further includes forming a second conductive feature over the conductive pillar and the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device structure, comprising:
a first dielectric layer over a semiconductor substrate;
a first conductive feature in the first dielectric layer;
a second conductive feature over the first dielectric layer;
a conductive via between the first conductive feature and the second conductive feature, wherein the conductive via comprises:
an etching stop layer partially covering the first conductive feature, so that a portion of the first conductive feature laterally protrudes from sidewalls of the etching stop layer;
a conductive pillar over the etching stop layer; and
a capping layer surrounding the conductive pillar and the etching stop layer and covering a top surface of the portion of the first conductive feature laterally protruded from the sidewalls of the etching stop layer, wherein a portion of the capping layer extends between the conductive pillar and the second conductive feature and wherein the first conductive feature and the second conductive feature are electrically connected to each other through the capping layer, the conductive pillar, and the etching stop layer; and
a second dielectric layer over the first dielectric layer and below the second conductive feature, wherein the second dielectric layer surrounds the conductive via, wherein an interface between the first dielectric layer and the second dielectric layer is substantially coplanar with an interface between the etching stop layer and the first conductive feature.

2. The semiconductor device structure as claimed in claim 1, wherein the second conductive feature over the second dielectric layer is wider than the conductive pillar surrounded by the second dielectric layer and narrower than the first conductive feature below the second dielectric layer.

3. The semiconductor device structure as claimed in claim 1, wherein the sidewalls of the etching stop layer are substantially coplanar with sidewalls of the conductive pillar.

4. The semiconductor device structure as claimed in claim 1, wherein the capping layer covers sidewalls of the conductive pillar and the sidewalls of the etching stop layer.

5. The semiconductor device structure as claimed in claim 1, wherein a portion of the capping layer extends from the sidewalls of the etching stop layer until the portion of the capping layer substantially aligns with sidewalls of the first conductive feature.

6. The semiconductor device structure as claimed in claim 1, wherein the capping layer separates the second dielectric layer from the conductive pillar, the etching stop layer, and the first conductive feature in the first dielectric layer.

7. A semiconductor device structure, comprising:
a first dielectric layer over a semiconductor substrate;
a first conductive feature in the first dielectric layer;
a second dielectric layer over the first dielectric layer;
a conductive via surrounded by the second dielectric layer;
an etching stop layer over the second dielectric layer;
a third dielectric layer over the etching stop layer; and
a second conductive feature in the third dielectric layer and the etching stop layer, wherein the first conductive feature and the second conductive feature are electrically connected to each other through the conductive via, and wherein the second dielectric layer adjoins the first dielectric layer and fills a corner between the conductive via and the second conductive feature.

8. The semiconductor device structure as claimed in claim 7, wherein an interface between the second conductive feature and the conductive via is substantially coplanar with an interface between the second conductive feature and the second dielectric layer.

9. The semiconductor device structure as claimed in claim 7, wherein an interface between the second conductive feature and the conductive via is substantially coplanar with an interface between the etching stop layer and the second dielectric layer.

10. The semiconductor device structure as claimed in claim 7, wherein the second conductive feature comprises a conductive layer and a barrier layer between the conductive layer and the third dielectric layer, and wherein the barrier layer adjoins the third dielectric layer, the etching stop layer, the second dielectric layer, and the conductive via.

11. The semiconductor device structure as claimed in claim 7, wherein the first conductive feature comprises a conductive layer and a barrier layer between the conductive layer and the first dielectric layer, and wherein the conductive via comprises a conductive pillar and a capping layer surrounding the conductive pillar, and the capping layer separates the conductive pillar, the conductive layer and the barrier layer from the second dielectric layer.

12. The semiconductor device structure as claimed in claim 11, wherein the capping layer of the conductive via uniformly extends over the barrier layer, the conductive layer, and the conductive pillar.

13. A semiconductor device structure, comprising:
a first dielectric layer over a semiconductor substrate;
a first conductive layer in the first dielectric layer;
a first conductive barrier layer surrounding the first conductive layer and separating the first conductive layer from the semiconductor substrate;
a second dielectric layer over the first dielectric layer;
a second conductive layer in the second dielectric layer;
a second conductive barrier layer surrounding the second conductive layer and between the first conductive layer and the second conductive layer;
a third dielectric layer between the first dielectric layer and the second dielectric layer;
a conductive pillar in the third dielectric layer and between the first conductive layer and the second conductive layer;
a third conductive barrier layer surrounding the conductive pillar and covering a top surface of the conductive pillar to separate the conductive pillar from the second conductive barrier layer; and
a conductive etching stop layer surrounded by the third conductive barrier layer and separating the conductive pillar from the first conductive layer.

14. The semiconductor device structure as claimed in claim 13, wherein the third conductive barrier layer adjoins the first conductive barrier layer and the second conductive barrier layer.

15. The semiconductor device structure as claimed in claim 14, wherein the third conductive barrier layer separates the first conductive layer from the third dielectric layer.

16. The semiconductor device structure as claimed in claim 13, wherein the third conductive barrier layer and the conductive pillar comprise the same metal atoms.

17. The semiconductor device structure as claimed in claim 13, further comprising an etch stop layer sandwiched between the second dielectric layer and the third dielectric layer and adjoining the second conductive barrier layer.

18. The semiconductor device structure as claimed in claim 13, wherein the second conductive layer surrounded by the second conductive barrier layer is wider than the conductive pillar surrounded by the third conductive barrier layer and narrower than the first conductive layer surrounded by the first conductive barrier layer.

19. The semiconductor device structure as claimed in claim 13, further comprising an etch stop layer between the first dielectric layer and the semiconductor substrate and adjoining the first conductive barrier layer.

20. The semiconductor device structure as claimed in claim 1, wherein a top surface of the second dielectric layer is substantially coplanar with an interface between the second conductive feature and the conductive via.

* * * * *